United States Patent
Sormani et al.

(10) Patent No.: US 8,410,500 B2
(45) Date of Patent: Apr. 2, 2013

(54) LIGHT-EMITTING APPARATUS WITH SHAPED WAVELENGTH CONVERTER

(75) Inventors: Joseph Ludovicus Antonius Maria Sormani, Eindhoven (NL); Egbert Lenderink, Eindhoven (NL); Matthias Daniel Epmeier, Aachen (DE); Aldegonda Lucia Weijers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 933 days.

(21) Appl. No.: 12/519,439

(22) PCT Filed: Dec. 14, 2007

(86) PCT No.: PCT/IB2007/055109
§ 371 (c)(1),
(2), (4) Date: Jun. 16, 2009

(87) PCT Pub. No.: WO2008/078235
PCT Pub. Date: Jul. 3, 2008

(65) Prior Publication Data
US 2010/0019265 A1    Jan. 28, 2010

(30) Foreign Application Priority Data
Dec. 21, 2006 (EP) ................................. 06126787

(51) Int. Cl.
*H01L 33/00* (2010.01)
(52) U.S. Cl. .................. 257/98; 257/E33.067
(58) Field of Classification Search .............. 257/98, 257/E33.067
See application file for complete search history.

(56) References Cited

U.S. PATENT DOCUMENTS

| 3,709,827 | A | 1/1973 | Auzel | |
|---|---|---|---|---|
| 6,791,259 | B1 | 9/2004 | Stokes et al. | |
| 6,939,481 | B2 | 9/2005 | Srivastava et al. | |
| 2004/0145308 | A1 | 7/2004 | Rossner et al. | |
| 2004/0227148 | A1* | 11/2004 | Camras et al. | 257/99 |
| 2005/0151141 | A1* | 7/2005 | Grotsch et al. | 257/81 |
| 2005/0269582 | A1* | 12/2005 | Mueller et al. | 257/94 |
| 2006/0011935 | A1 | 1/2006 | Krames et al. | |
| 2006/0091411 | A1* | 5/2006 | Ouderkirk et al. | 257/98 |
| 2006/0091784 | A1 | 5/2006 | Conner et al. | |

FOREIGN PATENT DOCUMENTS

| EP | 1503434 A2 | 2/2005 |
|---|---|---|
| EP | 1526580 A2 | 4/2005 |
| JP | 2005079167 | 3/2005 |
| WO | 2006103582 A1 | 10/2006 |

* cited by examiner

*Primary Examiner* — Stephen W Smoot
*Assistant Examiner* — Vicki B Booker
(74) *Attorney, Agent, or Firm* — David Zivan; Mark Beloborodov (57) ABSTRACT

Proposed is a light-emitting apparatus 200,300,400, comprising a semiconductor light emitting device 220,320,420 and a transparent ceramic body 230,330,430 comprising a wavelength converting material positioned in light receiving relationship to the semiconductor device. The light-emitting apparatus is characterized in that the side surfaces 233,333, 433 of the ceramic body 230,330,430 are at an oblique angle 234,334,434 relative its bottom surface 231,331,431. This is especially advantageous to unlock the wave-guide modes inside the body 230,330,430. Consequently the total flux emitted from the light-emitting apparatus 200,300,400 can be enhanced considerably. Alternatively, the brightness of the top surface 232,332,432 of the ceramic body 230,330,430 can be enhanced considerably.

8 Claims, 7 Drawing Sheets

LIGHT-EMITTING APPARATUS WITH SHAPED WAVELENGTH CONVERTER

FIELD OF THE INVENTION

The invention relates to a light-emitting apparatus comprising a semiconductor light-emitting device and a ceramic wavelength conversion body. Such light-emitting apparatuses are well known and used in particular as light sources in indicators, display backlighting units, automotive (head-) lamps and general-purpose illuminators.

BACKGROUND OF THE INVENTION

An embodiment of a light-emitting apparatus of the kind set forth is known from US2005/0269582. That document discloses a semiconductor device comprising a light-emitting layer disposed between an n-type and a p-type region in combination with a ceramic body, which is disposed in a path of the light emitted by the light-emitting layer. The ceramic body is composed of (or includes) a wavelength converting material, such as a phosphor. Typically these ceramic materials are based on Yttrium Aluminum Garnet (YAG), Yttrium Aluminum Silicon Oxo-Nitrides (YSN), Silicon Aluminum Oxo-Nitrides (SiAlON) or Lutetium Aluminum Garnet (LuAG). It is well known in the art that the 'primary' light emitted by III-nitride LEDs can be converted into 'secondary' light having a longer peak wavelength than the primary light by using the above described ceramic materials. The wavelength converting material can be chosen to obtain a particular peak wavelength of the secondary light. Furthermore, the size and thickness of the ceramic body and/or the concentration of the wavelength converting material can be chosen such that the light emitted by the apparatus is either a mixture of 'primary' and 'secondary' light or substantially consists of only the 'secondary' light. The advantage of this approach lies in the fact that the above-described luminescent ceramic bodies are robust and show a low sensitivity to temperature changes. Furthermore, such luminescent ceramics exhibit (almost) no scattering and therefore have a good conversion efficiency compared to phosphor layers.

As a result of the absence of scatterers the transparent luminescent ceramic body described in US2005/0269582 is a volume emitter with an index of refraction (substantially) larger than 1. This is a considerable drawback, because the primary light transmitted and the secondary light generated by the luminescent ceramic body can be emitted from the body only within the escape cones extending from all body surfaces. In other words, all the light outside these cones is locked inside the ceramic body in so-called waveguide modes. This light is not available for use in the application of the light-emitting apparatus. This unavailability is a clear disadvantage both for étendue critical applications (in which the brightness of the top surface of the ceramic body is of importance) as well as for lumen critical applications (in which the total flux emitted by the ceramic body is of importance). An additional disadvantage of the prior art is that a considerable amount (up to 80% for rectangular bodies) of the light emitted by the transparent luminescent ceramic body is emitted through the side surfaces and therefore not available for use in étendue critical applications.

SUMMARY OF THE INVENTION

It is an object of the present invention to provide a light-emitting apparatus of the kind set forth, in which light output from the luminescent ceramic body is enhanced. This object is achieved with the light-emitting apparatus according to the invention as defined in claim 1. A light-emitting apparatus comprising a semiconductor light emitting device comprising a light-emitting layer disposed between an n-type region and a p-type region, a transparent ceramic body comprising a wavelength converting material positioned in light receiving relationship to the semiconductor device, the ceramic body further having a bottom surface facing towards the semiconductor device, characterized in that the ceramic body has at least one side surface at an oblique angle with respect to said bottom surface in order to unlock waveguide modes from said ceramic body.

The invention provides a light-emitting apparatus in which the wave-guide modes are unlocked through the application of the oblique side surfaces. Hence, the ceramic body can emit the light formerly trapped in these modes. Consequently the light output from the ceramic body can be more than twice as high as the light output from bodies without oblique side surfaces. Moreover, also the brightness of the device can be enhanced with about the same factor.

In an embodiment of the present invention the oblique angle is larger than 95° or smaller than 85°. Even better still, the oblique angle is larger than 100° or smaller than 80°.

According to an embodiment of the present invention at least one oblique side surface of the ceramic body has a reflective coating. This is advantageous to enhance the flux through and the brightness of the top surface even further.

In an embodiment of the light-emitting apparatus according to the invention an intermediate layer having a lower index of refraction than the ceramic body is accommodated between the body and the reflective coating. The efficiency of the reflection is improved by the application of the intermediate layer.

In an embodiment of the invention the ceramic body has a top surface provided with a micro-corrugation. The application of a micro-corrugation enhances the light extraction from and/or the brightness of on the top surface of the ceramic body.

In an embodiment the ceramic body has a top surface provided to include an optical function. Advantageously an application specific radiation distribution from the light-emitting apparatus is realized.

In an embodiment the ceramic body has a top surface provided with a reflective coating. This embodiment can beneficially used as a side emitter in certain application, e.g. to couple light into a light-guide.

According to an embodiment an intermediate layer having a lower index of refraction than the ceramic body is accommodated between the body and the reflective coating on the top surface.

Figure 9:
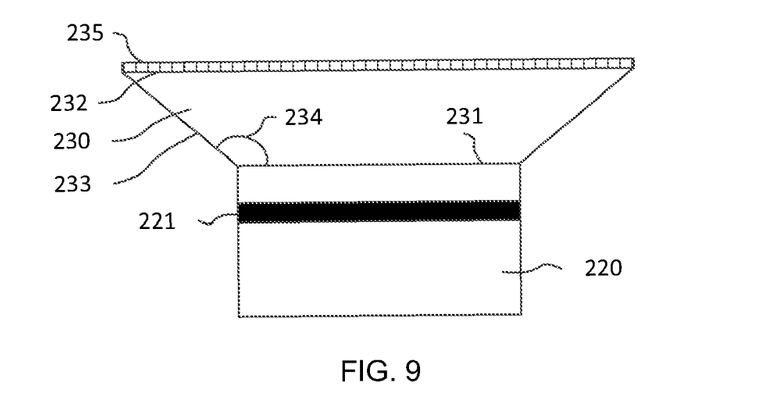
FIG. 9 shows a light-emitting apparatus according to the invention in which a top surface of a ceramic wavelength conversion body is provided with a micro-corrugation.

In an embodiment, as illustrated in FIG. 9, an intermediate layer 236 having a lower index of refraction than the ceramic body 230 is accommodated between the bottom surface 231 and the semiconductor light-emitting device 220. Again this is beneficial to enhance the efficiency of the reflection at the bottom surface.

These and other aspects of the invention will be apparent from and elucidated with reference to the embodiments described hereinafter.

BRIEF DESCRIPTION OF THE DRAWINGS

Further details, features and advantages of the invention are disclosed in the following description of exemplary and preferred embodiments in connection with the drawings.

DETAILED DESCRIPTION OF THE EMBODIMENTS

Figure 1A:
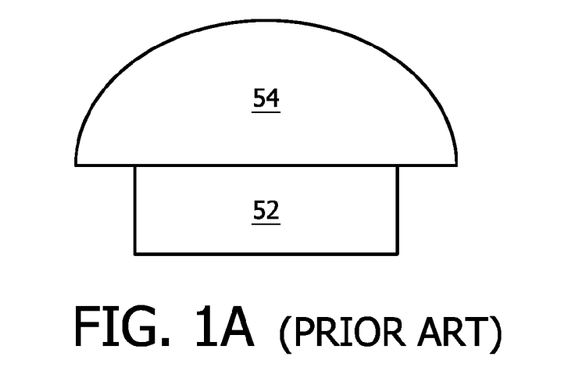
FIGS. 1A and 1B show two examples of a light-emitting apparatus comprising a semiconductor light-emitting device and a ceramic wavelength conversion body as known from the prior art.
Figure 1B:
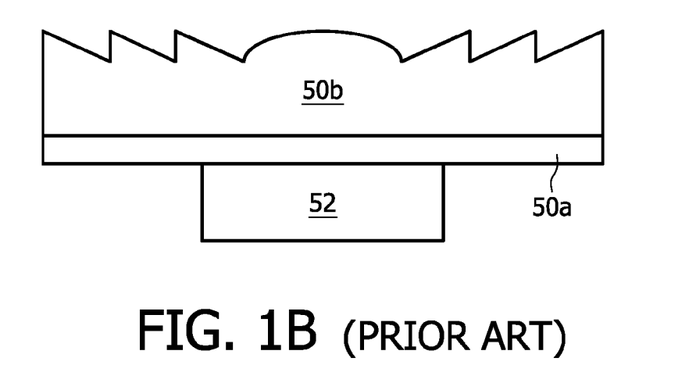

FIGS. 1A and 1B show two examples of a light-emitting apparatus comprising a semiconductor light-emitting device 52 and a ceramic wavelength conversion body 54, 50a, 50b as known from US2005/0269582. In FIG. 1A the ceramic wavelength converting body 54 is shaped to form a dome lens. In FIG. 1B a second ceramic wavelength converting body 50b is shaped to form a Fresnel lens and located on top of a first rectangular ceramic wavelength converting body 50a. The lens shape of the body 54, 50b in the prior art should avoid total internal reflection (TIR) at the interface between the high index of refraction body and the low index of refraction air. The TIR is avoided (or at least minimized) by shaping the lens 54 with a radius of curvature considerably larger than the light-emitting device 52. It is clear, however, that in both embodiments of FIG. 1 TIR still occurs—and consequently locking of light in wave guide modes—even at the shaped surfaces of the ceramic wavelength conversion bodies 50a, 50b, 54. Furthermore, due to the radius of curvature requirement the ceramic body 50a,50b,54 is substantially larger than the semiconductor device 52, thus reducing the brightness of the lighting apparatus. Moreover, a considerable amount of light (up to 80%) is emitted by the side surfaces of the ceramic bodies 50a,50b,54 and is therefore substantially lost for the use of the light-emitting apparatus in étendue critical applications.

Figure 2:
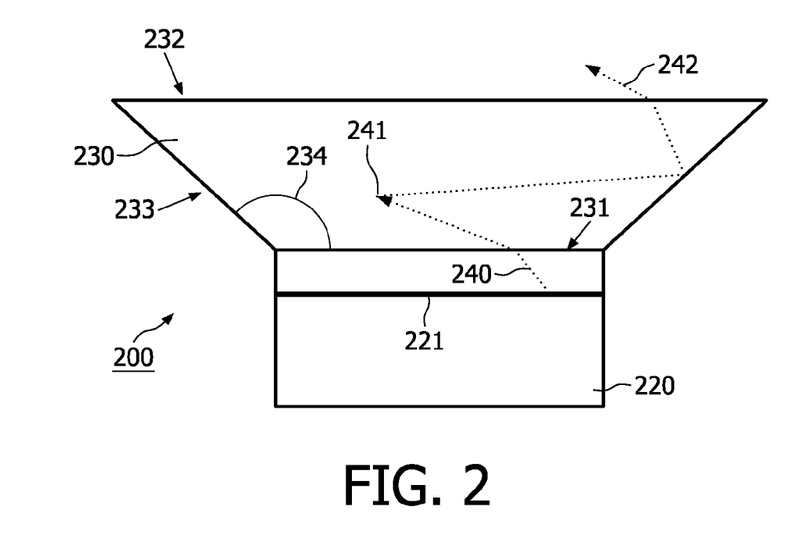
FIG. 2 shows a light-emitting apparatus comprising a semiconductor light-emitting device and a ceramic wavelength conversion body according to the invention with oblique side surfaces.

In FIG. 2 an embodiment of the invention is schematically depicted, showing a light-emitting apparatus 200, comprising a semiconductor light-emitting device 220 and a ceramic wavelength converting body 230. The semiconductor device 220 has a light-emitting layer 221 disposed between an n-type region and a p-type region. The ceramic body 230 has a bottom surface 231 facing towards the semiconductor device 220 and oriented substantially parallel to the light-emitting layer 221. Furthermore, the ceramic body 230 has a top surface 232 and one or more side surfaces 233 at an oblique angle 234 with respect to the bottom surface 231 in order to enhance the light output from the body. The oblique angle 234 can either be sharp (<90°) or blunt (>90°).

The 'primary' light 240 emitted by the light-emitting layer 221 is received and (at least partially) absorbed at a point 241 inside the ceramic wavelength converting body 230. The 'secondary' light 242 is radiated from point 241 over a solid angle of 4π. As the index of refraction of the ceramic body 230 is larger than 1, both the 'primary' 240 and 'secondary' light 242 are trapped inside the body due to total internal reflection, unless they are inside the escape cone. Especially for transparent bodies 230, i.e. which do not contain scattering centers such as pores or voids, the amount of light trapped in the waveguide modes is considerable. By shaping the side surfaces 233 of the ceramic body 230 at an oblique angle 234 with respect to the bottom surface 231, the light that is normally trapped can escape from the body.

Although in FIG. 2 the ceramic wavelength converting body 230 is essentially adjacent to the semiconductor light-emitting device 220, it is to be understood that this is not essential for the invention. Also, the bottom surface 231 being parallel to the light-emitting layer 221 is not essential to the invention. In an embodiment of the invention (see FIG. 3) the ceramic body 330 is positioned at a distance from the semiconductor device 320, albeit in light receiving relationship to that device. Such an embodiment is known as 'remote fluorescence' or 'remote phosphorescence'. The light emitted by the semiconductor device 320 is oriented towards the 'bottom' surface 331 of the ceramic wavelength converting body 330, directly and/or via any suitable optical system 360 known in the art. The light-emitting apparatus 300 can be advantageously used in applications such as general illuminators, recessed luminaries and even backlight units for displays. Furthermore, the apparatus 300 can be assembled such that the side surfaces 333 are either 'inside' (see FIG. 3) or 'outside' the optical system 360. In the later case, the light emitted from the side surfaces 333 can be advantageously used in appropriate lighting applications.

Figures 3, 4:
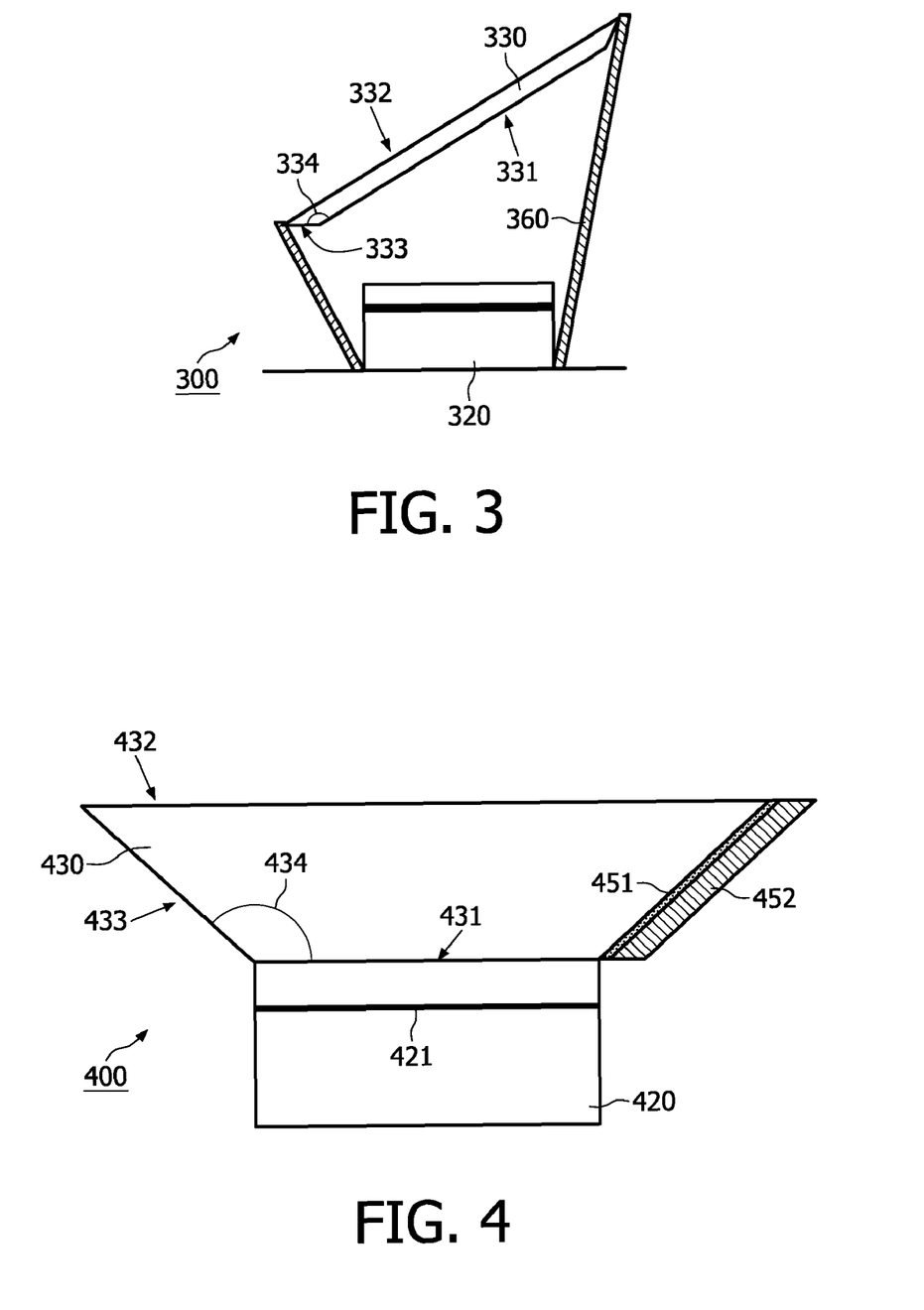
FIG. 3 shows a light-emitting apparatus according to the invention in which the ceramic wavelength converting body is applied in a 'remote fluorescence' configuration.
FIG. 4 shows a light-emitting apparatus comprising a semiconductor light-emitting device and a ceramic wavelength conversion body according to the invention with a coated oblique side surface.

The increase in light output of the apparatus 200, 300 by implementing the invention is considerable. Consider for instance an idealized rectangular transparent ceramic wavelength converting body 230, 330 of size 1×1×0.1 mm³, with an index of refraction of 1.8 (similar to YAG), surrounded by air (n=1)–geometry 1 in table 1. In table 1 the influence is described the geometry of the ceramic body 230,330 has on the light flux through and luminance of the top, side, and bottom surfaces. Moreover, the loss of light, i.e. the light unavailable for application, in the wave-guide modes (WGM), at the bottom surface, or at the side surfaces is considered. Geometry 1 is representative of a remote fluorescence embodiment. Assuming the total amount of light generated inside the volume of the ceramic wavelength converting body 230,330 to be 100%, it can be shown using ray-tracing calculations that the amount of light locked inside the waveguide modes is about 48%. As every side of the rectangular body 230,330 emits an equal amount of light, it can be easily discerned that 8% of the light is emitted from the top surface 232,332 while the four side surfaces 233,333 emit 31% of the light. In contrast to a transparent body characterized by an equal flux emission from every surface, a homogeneous translucent body is characterized by an equal brightness of every surface. Assuming furthermore that in practical circumstances the light emitted through the bottom surface 231 cannot be used, the total flux unavailable to the application is 57% (49%+8%).

In geometry 2 the ceramic body 230 is modeled to have a reflective bottom surface 231, with a reflection coefficient of 80%. This geometry is representative of a rectangular ceramic wavelength converting body 230 positioned adjacent to a semiconductor device 220. Although this geometry refers to a prior art embodiment, reference to the numbered elements of FIG. 2 is still made for the convenience of the reader. In geometry 2 the light formerly locked in the wave-guide modes is essentially absorbed at the bottom surface 231, due to the multitude of 80% reflections occurring at this surface in the elongated rectangular 1×1×0.1 mm$^3$ body. Only a part of the light that was formerly emitted from the bottom surface 231 can now be emitted, after reflection, from the top surface 232 or the side surfaces 233. Overall 60% of the light generated inside the ceramic body 230 is not available in the lighting application.

In case of a remote fluorescent embodiment in which the side surfaces 233 are shaped at an oblique angle 234 (in this case 135°) relative to the bottom surface 231 of the ceramic body 230 (geometry 3), the total flux emitted from the ceramic body is considerably enhanced. The largest improvement is realized through unlocking the wave-guide modes via the top surface 232 of the ceramic body 230 (compare with geometry 1). The total flux available in a lighting application increases from 39% (8% top surface+31% side surfaces) of the light generated to 88% (29%+59%), again assuming that the flux through the bottom surface is not available. This geometry is especially suitable for lumen critical applications. These typically apply secondary optics appeasable to light received at large angles relative to their optical axis.

TABLE 1

Flux balance for different geometries of the ceramic wavelength converting body

| Geometry | Flux Top | Lum. Top | Flux Sides | Lum. Sides | Flux Bottom | Total Loss | Loss WGM | Loss Bottom | Loss Sides |
|---|---|---|---|---|---|---|---|---|---|
| 1 | 8% | 0.03 | 31% | 0.99 | 8% | 49% | 49% | 0% | 0% |
| 2 | 14% | 0.05 | 25% | 0.80 | 0% | 60% | 0% | 60% | 0% |
| 3 | 29% | 0.09 | 59% | 1.88 | 9% | 0% | 0% | 0% | 0% |
| 4 | 33% | 0.11 | 33% | 1.05 | 0% | 34% | 0% | 34% | 0% |
| 5 | 33% | 0.11 | 0% | 0.00 | 0% | 67% | 0% | 41% | 26% |
| 6 (air-gap) | 36% | 0.12 | 0% | 0.00 | 0% | 64% | 0% | 50% | 14% |
| 7 | 0% | 0.00 | 22% | 0.07 | 0% | 78% | 0% | 78% | 0% |

Modeling an obliquely shaped ceramic body 230 adjacent to a semiconductor light-emitting device 220, as in geometry 4 in table 1, it can be discerned that the light formerly trapped in the wave-guide modes can now advantageously be used to enhance the light output from the top surface 232. Compared to geometry 2 the total flux emitted from the ceramic body 230 increases from 39% (14% top surface+25% side surfaces) to 66% (33%+33%). Moreover, while the flux through the top surface 232 is more than doubled the brightness of the top surface is enhanced twofold, due to the larger top surface area (in the calculations the bottom surface 231 was always fixed to 1×1 mm$^2$).

In order to enhance the brightness of the top surface 232 even further it is advantageous to apply a reflective coating to the oblique side surfaces 233 of the ceramic body 230, as in geometry 5. The reflective coating can be silver, aluminum or any other high reflective coating known in the art. Assuming an 80% reflectivity of the side surface coating the top surface 232 brightness increases twofold compared to geometry 2. This geometry is especially suitable for étendue critical applications.

In an embodiment of the invention a low index of refraction layer 451, i.e. $n_{layer} < n_{cer.body}$, between the side surfaces 433 and the reflective coating 452 is applied advantageously (see FIG. 4). In this case the light outside the escape cone from the side surface 433 will be reflected through TIR with 100% efficiency. The light inside the escape cone will be reflected by the reflective coating 452, which in practical circumstances is always less efficient. In contrast, applying the reflective coating 452 in direct optical contact with the side surfaces 433 will reduce the total reflective efficiency, as now also the light outside the escape cone is reflected less efficiently. Consequently, the application of the low index of reflection layer 451 enhances the flux emitted from the top surface 432 and its brightness even further (geometry 6 in table 1).

In another embodiment it is advantageous to corrugate the top surface 232,332,432 on a micro level to enhance the light extraction from and/or brightness of the top surface. Such a micro-corrugation can for example be created through etching of the top surface 232,332,432 to create a corrugated surface 235, as illustrated in FIG. 9.

In yet another embodiment the brightness of the top surface 232,332,432 is enhanced by corrugating that surface on a macro level, as for instance by shaping the top surface as a Fresnel lens, in order to include an optical function. This embodiment furthermore advantageously realizes an application specific radiation distribution from the light emitting apparatus 200,300,400.

Figure 10:
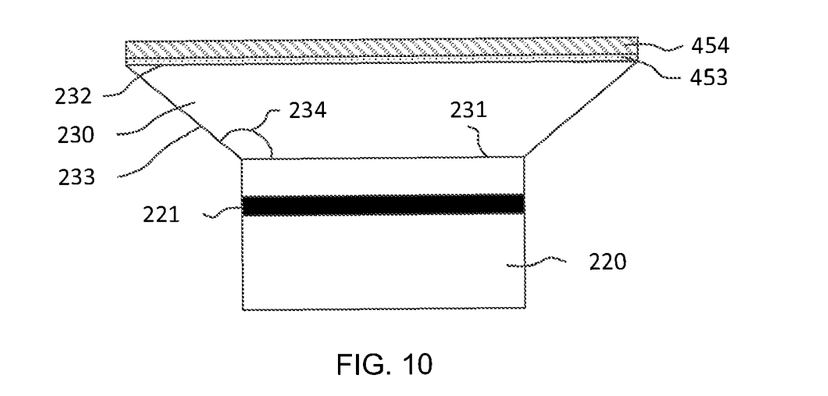
FIG. 10 shows a light-emitting apparatus according to the invention comprising a semiconductor light-emitting device and a ceramic wavelength conversion body according to the invention with an intermediate low index of refraction layer and a reflective coating on a top surface of the conversion body.
Figure 11:
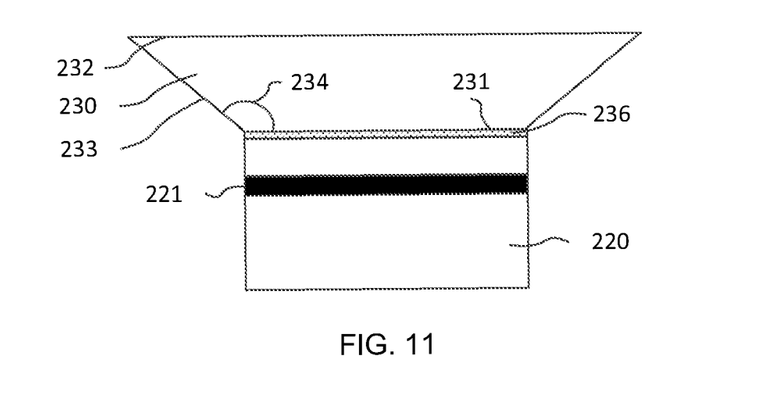
FIG. 11 shows a light-emitting apparatus according to the invention comprising a semiconductor light-emitting device and a ceramic wavelength conversion body according to the invention with an intermediate low index of refraction layer between a bottom surface of the conversion body and the semiconductor light-emitting device.

For certain applications it can be advantageous to limit the light emitted form the ceramic body 230 to the side surfaces 233 only, as in geometry 7. An example of such an application is the use of the light-emitting apparatus 200 as a side emitter to couple light into a light-guide. In this case, as illustrated in FIG. 10, the top surface 232 of the ceramic body 230 can be provided with a reflective coating 454 (with or without an intermediate low index of refraction layer 453.

It is noted that similar results as those in table 1 are obtained for an oblique angle of 45°, in which case the top surface 232 is smaller than the bottom surface 231 of the ceramic body 230.

In an embodiment of the invention the ceramic wavelength converting body 230, 430 is positioned adjacent to a semi-conductor device 220, 420 like the Philips Lumileds 'Saber'. These are so-called 'Flip Chip' InGaN based LEDs from which the sapphire substrate has been removed using e.g. laser lift-off techniques. This is especially advantageous as removing the 'intermediate' sapphire substrate will bring the ceramic body 230, 430 much closer to the light emitting layer 221, 421. Moreover, the absence of the sapphire substrate eliminates a loss-path of light generated in the body 230, 430. This loss-path would have been formed by light emitted through the bottom surface 231, 431 into the sapphire substrate and lost via the substrate's side surfaces.

Figure 5:
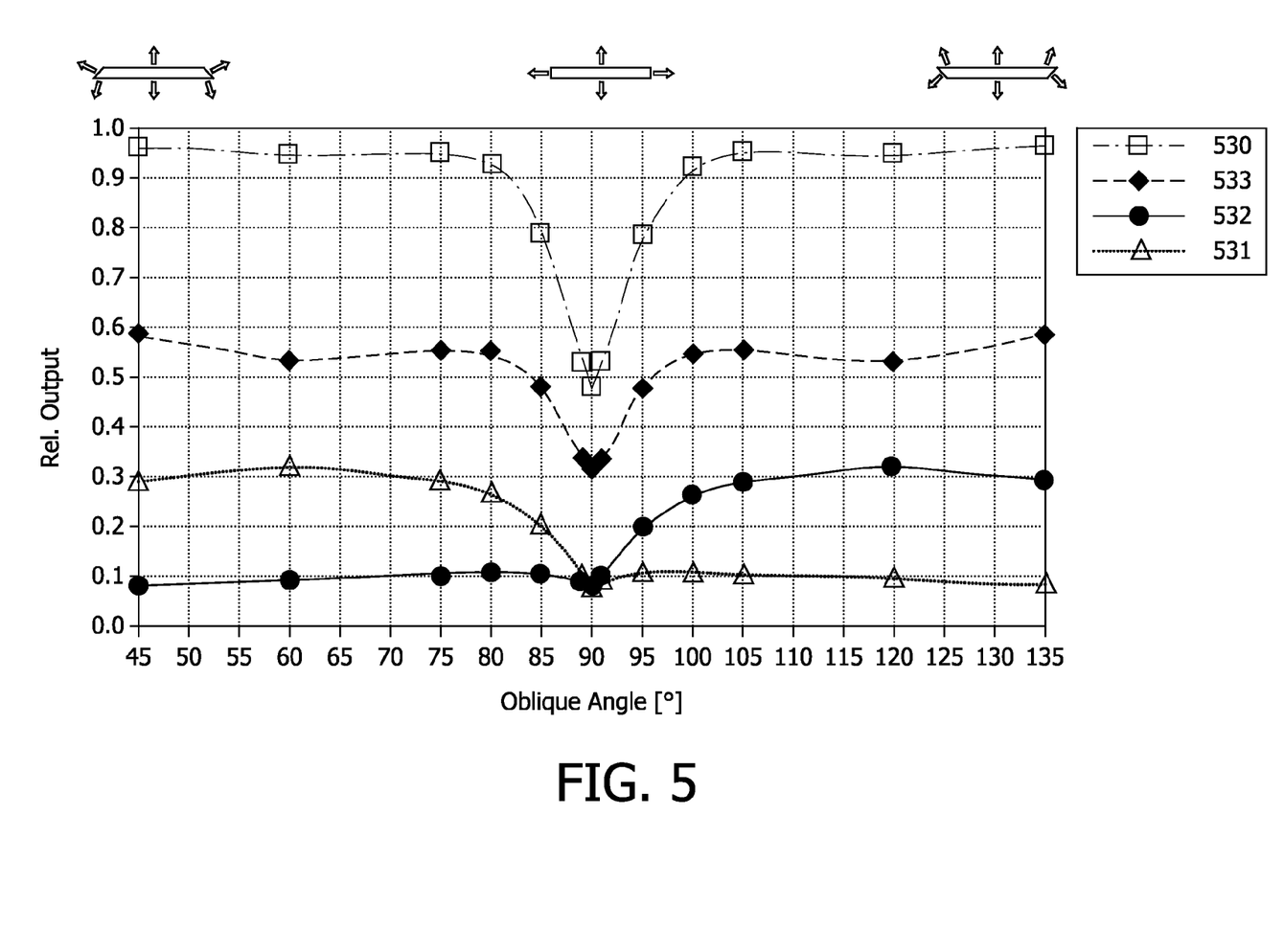
FIG. 5 shows the relative output of a ceramic wavelength conversion body according to the invention as a function of the oblique angle for a remote fluorescent application.

Turning to FIG. 5, the light emission from the ceramic body 330 in a remote fluorescence application is shown as a function of the oblique angle 334. At an angle 334 of 90° the body 330 is rectangular with equal size bottom 331 and top 332 surfaces. At oblique angles 334<90°, the bottom surface 331 is larger than the top surface 332. The reverse is true for angles >90°. As can be discerned it is advantageous to apply oblique angles 334<90° or >90° in order to enhance the bottom surface's flux 531, top surface's flux 532, side surfaces' flux 533, and total flux 530. Advantageously, the oblique angle 334 is <85° or >95°, or even better <80° or >100°.

Figure 6:
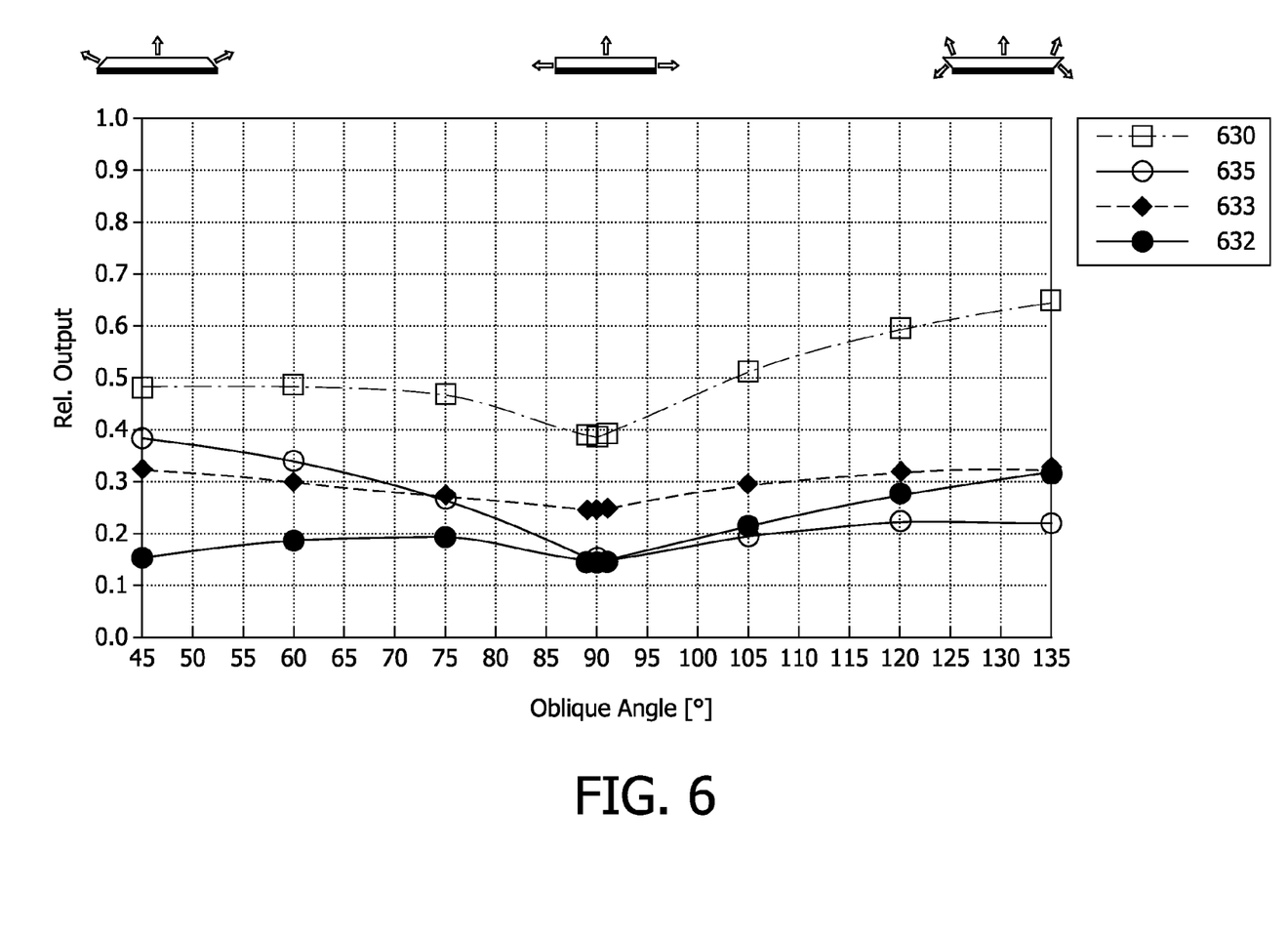
FIG. 6 shows the relative output and brightness of a ceramic wavelength conversion body according to the invention as a function of the oblique angle for a flux critical application.

FIG. 6 shows the relative flux output and brightness of a ceramic wavelength conversion body 230 according to the invention as a function of the oblique angle 234 for a flux critical application. Oblique angles 234<90° or >90° improve the total flux 630, the top surface's flux 632, and the side surfaces' flux 633 emitted. Especially oblique angles 234>95°—or better still >100°—are beneficially applied for flux critical applications. The top surface's brightness 635 (in Cd/mm$^2$), however, is beneficially improved for oblique angles 234<85°, or better still <80°.

Figure 7:
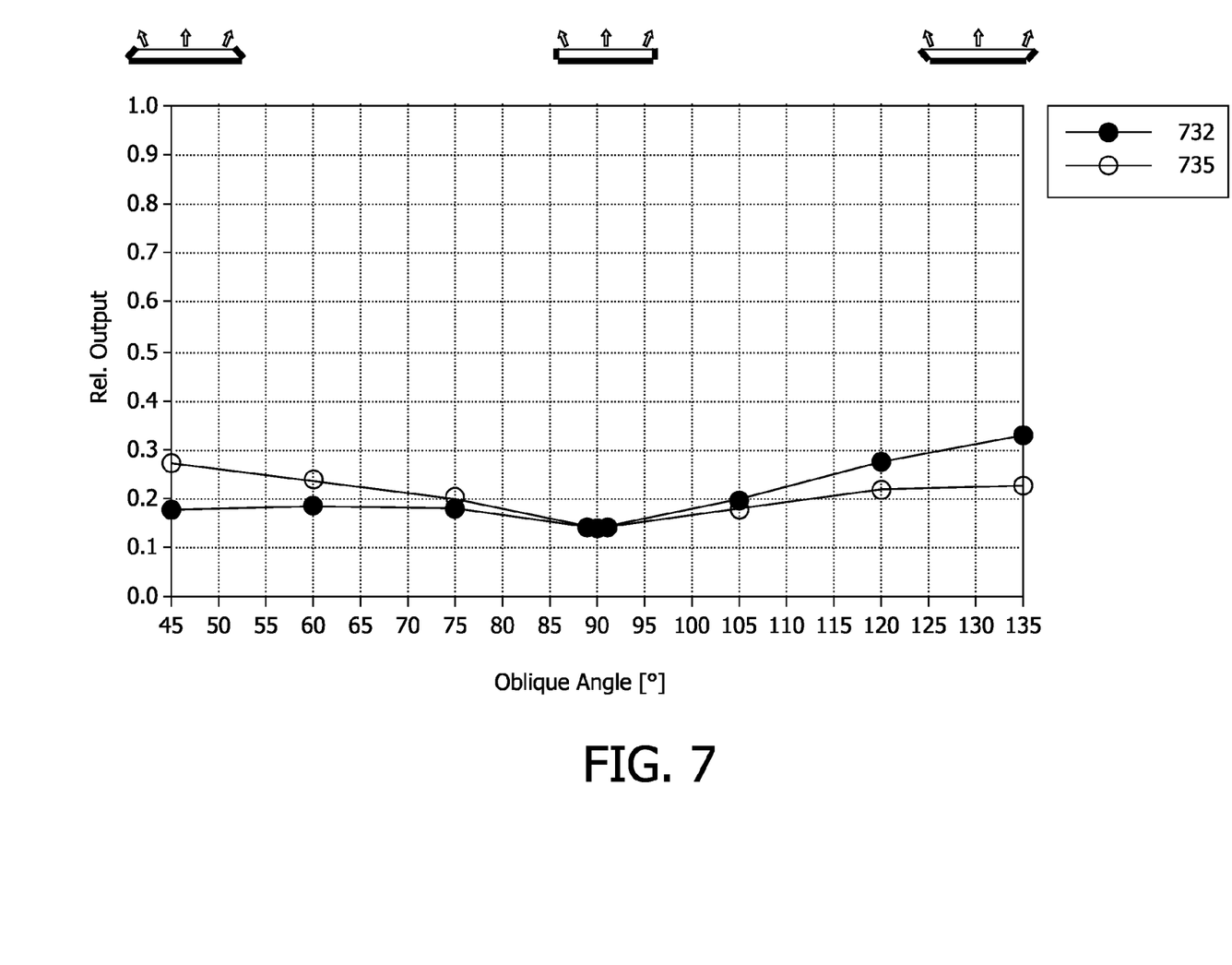
FIG. 7 shows the relative output and brightness of a ceramic wavelength conversion body according to the invention as a function of the oblique angle for an étendue critical application.

FIG. 7 shows the relative output and brightness of a ceramic wavelength conversion body 430 according to the invention as a function of the oblique angle 434 for an étendue critical application. With all side surfaces 433 coated with a reflective coating, the light can only be emitted through the top surface 432. Both the top surface's flux 732 and the top surface's brightness 735 are improved for oblique angles 434<90° and >90°, better still for angles <85° and >95°. The top surface 432 has a smaller area for oblique angles <90°. Consequently, the brightness 735 beneficially is enhanced for oblique angles 434<70°.

Figure 8:
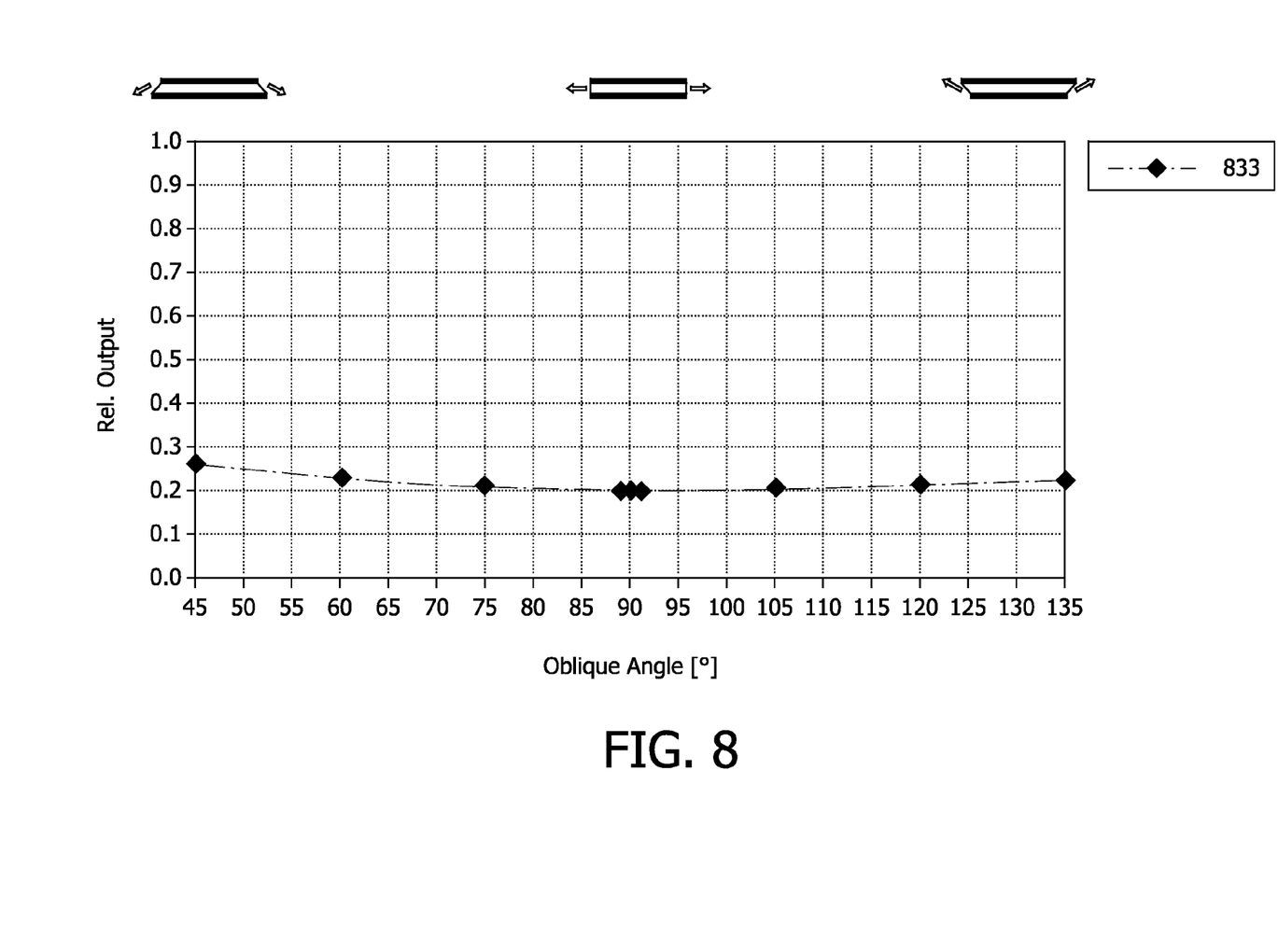
FIG. 8 shows the relative output of a ceramic wavelength conversion body according to the invention as a function of the oblique angle for a side emitter application.

FIG. 8 shows the relative output of a ceramic wavelength conversion body according to the invention as a function of the oblique angle for a side emitter application. As can be discerned form the Figure, the flux 833 emitted from the side surfaces is beneficially improved for oblique angles <90° and >90°.

Varying the index of refraction difference between the ceramic body 230,330,430 and the surrounding medium will not substantially influence the dependence of the flux 530, 532,630,632,732 emitted or the top surface brightness 635, 735 on the oblique angle 234,334,434. The flux level, however, is influenced, with an increase in flux for lower index of refraction differences.

Although the invention has been elucidated with reference to the embodiments described above, it will be evident that other embodiments may be alternatively used to achieve the same object. The scope of the invention is therefore not limited to the embodiments described above, but can also be applied to any other application device where a specific light radiation pattern is desired such as, for example, automotive head-lighting systems or display projection systems.

The invention claimed is:
1. A light-emitting apparatus comprising:
a semiconductor light emitting device comprising a light-emitting layer disposed between an n-type region and a p-type region, a transparent ceramic body comprising a wavelength converting material positioned in light receiving relationship to the semiconductor light-emitting device, the ceramic body further having a bottom surface facing towards the semiconductor light-emitting device, wherein the ceramic body has at least one side surface at an oblique angle with respect to the bottom surface, wherein at least one surface of the ceramic body has a reflective coating, and wherein an intermediate layer having a lower index of refraction than the ceramic body is disposed between the body and the reflective coating.

2. A light-emitting apparatus according to claim 1, wherein the oblique angle is larger than 95° or smaller than 85°.

3. A light-emitting apparatus according to claim 2, wherein the oblique angle is larger than 100° or smaller than 80°.

4. A light-emitting apparatus according to claim 1, wherein the at least one surface of the ceramic body is at least one oblique side surface of the ceramic body.

5. A light-emitting apparatus according to claim 1, wherein the ceramic body has a top surface provided with a micro-corrugation.

6. A light-emitting apparatus according to claim 1, wherein the ceramic body has a top surface provided to include an optical function.

7. A light-emitting apparatus according to claim 1, wherein the at least one surface of the ceramic body is a top surface of the ceramic body.

8. A light-emitting apparatus according to claim 1, wherein an other intermediate layer having a lower index of refraction than the ceramic body is accommodated between the bottom surface and the semiconductor light-emitting device.

\* \* \* \* \*